US008745110B2

(12) United States Patent
Antonini et al.

(10) Patent No.: US 8,745,110 B2
(45) Date of Patent: Jun. 3, 2014

(54) METHOD FOR COUNTING VECTORS IN REGULAR POINT NETWORKS

(75) Inventors: Marc Antonini, Nice (FR); Leonardo Hidd-Fonteles, Nice (FR)

(73) Assignees: Centre National de la Recherche Scientifique (CNRS), Paris (FR); Universite de Nice Sophia Antipolos, Nice (FR)

( * ) Notice: Subject to any disclaimer, the term of this patent is extended or adjusted under 35 U.S.C. 154(b) by 762 days.

(21) Appl. No.: 12/995,542

(22) PCT Filed: May 27, 2009

(86) PCT No.: PCT/FR2009/000618
§ 371 (c)(1),
(2), (4) Date: Feb. 22, 2011

(87) PCT Pub. No.: WO2009/156606
PCT Pub. Date: Dec. 30, 2009

(65) Prior Publication Data
US 2011/0131433 A1    Jun. 2, 2011

(30) Foreign Application Priority Data

Jun. 2, 2008 (FR) ..................................... 08 03020

(51) Int. Cl.
*G06F 17/16* (2006.01)
(52) U.S. Cl.
USPC ......................................................... 708/203
(58) Field of Classification Search
None
See application file for complete search history.

(56) References Cited

U.S. PATENT DOCUMENTS

| 7,106,228 | B2 | 9/2006 | Bessette et al. |
| 2004/0208244 | A1 | 10/2004 | Barlaud et al. |
| 2005/0285764 | A1 | 12/2005 | Bessette et al. |
| 2010/0054354 | A1* | 3/2010 | Tosato .......................... 375/260 |
| 2011/0093275 | A1* | 4/2011 | Li ................................. 704/500 |
| 2011/0131433 | A1* | 6/2011 | Antonini ....................... 713/320 |
| 2011/0137645 | A1* | 6/2011 | Vary et al. ..................... 704/222 |
| 2011/0235719 | A1* | 9/2011 | Antonini et al. ......... 375/240.22 |

FOREIGN PATENT DOCUMENTS

| WO | WO 99/33185 | 7/1999 |
| WO | WO 00/78052 | 12/2000 |
| WO | WO 03/103151 | 12/2003 |
| WO | WO 2008/104725 | 9/2008 |
| WO | WO 2009/156605 | 12/2009 |
| WO | WO 2010/001020 | 1/2010 |

OTHER PUBLICATIONS

Loyer, Pierre et al.; "Lattice Codebook Enumeration for Generalized Gaussian Source;" IEEE Transactions on Information Theory, vol. 49, No. 2, XP011074685, Feb. 1, 2003; pp. 521-528.

* cited by examiner

*Primary Examiner* — David H Malzahn
(74) *Attorney, Agent, or Firm* — Harness, Dickey & Pierce, P.L.C.

(57) ABSTRACT

The disclosure relates to a method for estimating the number of leader vectors with norm $l_p$ equal to $r_s^p \cdot d$, of dimension d, having co-ordinates which are lower than, or equal to k. The method is characterized in that r p delta, d is determined by the sum of the results of a function $T(X_i)$ for i varying between 1 and d, the function $T(X_i)$ providing, for at least some of the leader vectors, the result of the division of the co-ordinate $X_i$ raised to the power p by a delta precision factor, the result of the division being rounded to the nearest whole number. The method does not comprise a step of determining leader vectors.

6 Claims, 1 Drawing Sheet

METHOD FOR COUNTING VECTORS IN REGULAR POINT NETWORKS

CROSS-REFERENCE TO RELATED APPLICATIONS

This application is a National Phase Entry of International Application No. PCT/FR2009/000618, filed on May 27, 2009, which claims priority to French Application Serial No. 08/03020, filed on Jun. 2, 2008, both of which are incorporated by reference herein.

BACKGROUND AND SUMMARY

The present invention relates to the field of the processing of digital data for applications such as the compression of digital data, the search for digital data, the comparison of digital data or the decompression of digital data. The invention relates to the processing of audiovisual data and more generally any type of digital data. The aim of the invention is to reduce the processing time and the computing resource requirements with regard to both the computing power and the memory requirements.

The applications more particularly but not exclusively relate to the processing of images requiring a very large number of data to describe them. To reduce the transmission time and the size required for storage, information is compressed by extracting the visual information that alone will be coded. This coded information must be located in an optimum way in terms of frequency and in space to enable an optimum restitution while avoiding any redundancy detrimental to the performance of the coding. For this purpose, using the wavelet transform technique is known, the co-ordinates of which constitute a vector network that is then subjected to a vector quantization step.

The principle of vector quantization (VQ) is to code a sequence of samples forming a vector instead of coding each of the samples individually. The coding is done by approximating the sequence to be coded by a vector belonging to a catalogue of forms usually referred to as a "codebook". Each of the vectors of the codebook is indexed. During coding, the index of the nearest vector to the sequence of samples to be coded will be used to represent it.

The known solutions require the determination of each of the vectors, the recording thereof in a memory and then the execution of processing on all the vectors in order to count them. The vector base may require several gigabytes and the computing times for such a large base are lengthy. The aim of the invention is to propose a counting and indexing method avoiding these drawbacks.

The Application for the International Patent WO9933185 is known in the prior art, relating to a coding method consisting in determining a vector, referred to as the leader vector, which comprises the same components as the quantized vector but in a predetermined order, and then in determining the level or rank of said quantized vector in said formed set of vectors that have the same components as the leader vector and are, in said set, ordered in a predetermined manner. The method then consists in forming a code from on the one hand, an index representing said thus determined leader vector and on the other hand said rank. The main difficulty encountered for designing an algebraic vectorial quantiser for the compression is related to the problem of counting and indexing vectors in the regular point network (which constitutes the quantization dictionary). We present here the solutions that we have proposed for solving these problems in the case of a generalised Gaussian distribution source (such as for example the wavelet coefficients).

Algebraic Vector Quantization

Quantization has been studied for a few dozens of years now and the work done has developed numerous results that are today conventional on the rate/distortion theory. In particular, it has been shown that vector quantization (VQ) has numerous advantages compared with scalar quantization (SQ) when a fixed-length coding is required. In addition, the work by Shannon has shown that the performances of VQ are close to the optimum theoretical performances if the dimension n of the quantization vectors is sufficiently large.

However, it is important to note that VQ may get closer to these optimum performances at the cost of a high computing complexity; a complexity that exponentially increases with the dimension of the vectors. Generally, VQ is performed using a non-structured dictionary constructed from statistical data representing the source (learning sequence). In this case, the complexity and the storage requirements due to the size of the dictionary may become prohibitive for compression applications. In addition, there exists a problem of robustness of the dictionary which, although optimised for a given learning sequence, gives poor performance for an image outside the learning sequence. One solution for overcoming these problems is to use an n-dimensional structured VQ such as the Algebraic Vector Quantization (AVQ) or vector quantization on regular point networks. As the vectors of the dictionary are forced to belong to a structured regular network, the performances of the AVQ are in general inferior to those of the non-structured VQ. However, in most applications, this slight disadvantage is compensated for by the fact that, for the AVQ, no dictionary needs to be generated or stored, and that the coding complexity is reduced.

Quantization by regular point networks may be seen as an extension of the uniform scalar quantization. As in the case of the non-structured VQ, the term AVQ will be used in the rest of the document either to designate the vector quantization or to designate a vector quantizer. The AVQ takes into account the spatial dependencies between the coefficients of the vectors and the gains in partitioning and form. Whatever the distribution of the source, the AVQ is always more effective than the SQ.

A regular point network in $R^n$ is composed of all the possible combinations of a set of linearly independent vectors $a_i$ that constitutes the base of the network $\{y|y=u_1a_1+u_2a_2+\ldots u_na_n\}$ where the coefficients $u_i$ are integers. The partitioning of the space is then regular and only depends on the base vectors chosen. Each base defines a different regular point network. The AVQ offers the possibility of considerably reducing the computing and storage costs compared with a VQ designed by means of algorithms based on the generalised Lloyd algorithm. This is because using the vectors of a regular network as quantization values eliminates the operation of constructing a dictionary: the dictionary is implicitly constructed through the structure of the network chosen. The article by Conway and Sloane "Fast quantizing and decoding algorithms for quantizers and codes" published in IEEE Trans. On Information Theory, vol. 28, no 2, pp. 227-232 Mar. 1982 describes fast quantization algorithms that simply use counting operations and only depend on the dimension n of the vectors. In 1979, Gersho made the conjecture that, in the asymptotic case (i.e. for high rates), the rate/distortion performances of an AVQ are approximately optimum. However, although the AVQ is not mathematically optimum for low rates, the reduction in complexity afforded by such quantizers makes it possible to use large dimensions of vectors, which gives rise to better experimental performances for a given rate. Good rate/distortion performances can be obtained by combining the AVQ with an entropic coder, which motivated a few works on the AVQ in the field of wavelets. Many theoretical works on the VQ have been carried out for Gaussian and Laplacian sources; however, in the case of sources of the generalised Gaussian type with a decrease parameter of less than one, it was shown that the cubic network $Z^n$ was better in terms of rate/distortion than the network $E_8$ and the Leech network. This result spurred on our work to combine the AVQ with the wavelet transform.

Problems Dealt with by the Invention

Though the quantization by the AVQ is not very complex, because of the regular geometric structure of the dictionary, the implementation thereof is however not immediate. In the case of non-asymptotic models, the overload noise is ignored since we assume the use of a variable-length coding and an infinite dictionary. It raises in fact a certain number of concrete questions, in particular in terms of computing and storage. Two fundamental problems can be put forward in the design of an AVQ:
  a) Indexing: Indexing is an operation independent of the quantization. It consists in assigning to each quantized vector an index that, once coded, is transmitted over a channel to the decoder.
This operation is fundamental in the compression chain. It determines in fact the bit rate and enables vectors to be decoded without ambiguity. The known methods are generally very inexpensive in terms of memory but have a not insignificant computing complexity (recursive algorithms) or only function in particular cases (particular types of network or truncation). The invention relates to a more general approach that enables the indexing on distributions of the generalised Gaussian type, giving rise to a good compromise between memory cost and computing cost. The first patent proposes a solution to this problem.
  b) Counting. The indexing methods are generally based on the knowledge of the network population. Thus we must be capable of counting the vectors in the network on n-dimensional surfaces (or within n-dimensional volumes) that depend on the source distribution. A conventional counting approach is based on the use of generating series. In this formalism, the functions Nu have been introduced. They enable counting on pyramids, i.e. in the case of a Laplacian distribution.
The present invention more particularly relates to the step of counting on distributions of the generalised Gaussian type, achieving a good compromise between memory cost and computing cost. The second patent proposes a solution to this problem. Our contribution mainly concerned counting and indexing and the implementation of AVQ in the context of image or video compression applications. The use of these two approaches and of the AVQ remains perfectly valid for the compression of the audio signal (sound, speech, music).

To this end, the invention relates to, according to its most general acceptance, a method for estimating the number of leader vectors of norm $l_p$ equal to $r_{\delta,d}{}^p$ of dimension d and the co-ordinates of which are lower than or equal to k, wherein $r_{\delta,d}{}^p$ is determined by the sum of the results of a function $T(x_i)$ for i varying between 1 and d, the function $T(x_i)$ providing, for at least some of the leader vectors, the result of the division of the co-ordinate $x_i$ raised to the power p by a delta precision factor, the result of the division being rounded to the nearest whole number, the method not including a step of determining leader vectors. Preferably, for values of n between d and 1, the sum of the result of a function $\bar{q}_\delta{}^p(r-T(u), n-1, u)$ is carried out, for u varying between a minimum value $u_{min}(r, n)$ and k, the function $\bar{q}_\delta{}^p(r, n, k)$ providing the quantity of leader vectors of norm $r_{\delta,n}{}^p = r$, of dimension n and the co-ordinates of which are lower than or equal to k, the function $u_{min}$, providing the smallest integer value u that satisfies $T(u)$ greater than or equal to r/n.

Advantageously, a prior initialisation step is carried out consisting in attributing, for n=1, to the function $\bar{q}_\delta{}^p(r, 1, k)$ a value corresponding to a number of the possible values of u smaller than or equal to k, such that $T(u)=r$, and then executing the summing step. The invention also relates to an application of the estimation method for estimating the rate in the context of data compression and for indexing leader vectors.

BRIEF DESCRIPTION OF THE DRAWINGS

The invention will be better understood from reading a non-limitative example embodiment, referring to the appended drawings, where.

DETAILED DESCRIPTION

Figure 1:
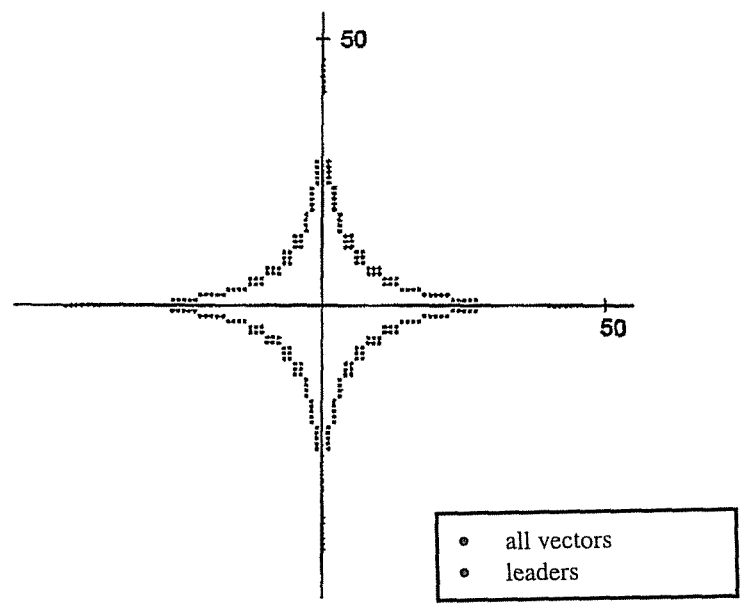
FIG. 1 shows an example of an envelope of $r_{\delta,2}{}^p = 15$, p=0.4 and $\delta = 0.3$ for a network Z2.

The indexing of the network vectors is an essential problem in network quantization applications. The invention relates to a solution to this problem using the network leader vectors and the context of the theory of partitions. It functions for generalised Gaussian distribution sources and enables the use of product codes. It also makes it possible to count vectors of a high dimension.

Vector quantization (VQ) could make it possible to obtain optimum theoretical performances if the vectorial dimension is arbitrarily high. Unfortunately, the computing complexity of the optimum non-structured VQ, such as LBG, exponentially increases with the dimension. In addition, the storage requirements may be very great. One solution to this problem of dimensionality is the use of constrained VQ such as network vector quantization (LVQ).

The LVQ approach leads to the design of a structured dictionary the code vectors of which are regularly distributed in space. Consequently, instead of optimising the position of the vectors in space, it is possible to adapt the source by indexing the network vectors in accordance with the form of its distribution. For most real data sources this may be done effectively by using a product code, leading to an optimum rate/distortion compromise for symmetrical unimodal source distributions.

As a matter of fact, it is possible to interpret such distributions as being a set of concentric hypersurfaces having the same form according to the source distribution. It is then possible to index the network code words by assigning a first index (prefix) corresponding to the norm (radius) of the respective surface and a second single index (suffix) corresponding to the counting of the vectors belonging to the same surface.

A large number of important data sources, such as sub-band speech and image coefficients, in particular those obtained by wavelet transformation, can be modelled by the generalised Gaussian distributions. This family of distributions is parameterised by a unique shape factor p (GG(p)) for a univariate stochastic variable. An interesting property of the sources having distributions (GG(p)) is that the envelopes of norm $l_p$ correspond to constant probability surfaces. This leads to the development of effective product codes.

Even if the calculation of the prefix is trivial, the suffix requires the counting and the indexing of the network vectors situated on given hypersurfaces. In addition, the increase in the dimension of the space may make the indexing and counting operation very complex, since the number of vectors situated on an envelope greatly increases with the norm, as illustrated by the following table, showing the comparison of the number of leaders of a given hyperpyramid and the total number of network vectors situated on this hyperpyramid (cardinality) in the case of a norm $l_1$, for a network $Z^n$ and different dimension and norm values.

| Dimension | Norm | Number of leaders | Cardinality |
|---|---|---|---|
| 3 | 10 | 13 | 402 |
|  | 400 | 884 | 640002 |
|  | 1000 | 83834 | 4000002 |
| 9 | 10 | 41 | 1854882 |
|  | 172 | $1.37 \cdot 10^8$ | $9.74 \cdot 10^{15}$ |
|  | 1842 | $9.98 \cdot 10^{15}$ | $1.68 \cdot 10^{24}$ |
| 18 | 10 | 42 | 317222212 |
|  | 29 | 4426 | $8.42 \cdot 10^{15}$ |
|  | 450 | $9.89 \cdot 10^{15}$ | $9.39 \cdot 10^{15}$ |
| 60 | 5 | 7 | 207648024 |
|  | 11 | 56 | $1.90 \cdot 10^{15}$ |
|  | 303 | $9.88 \cdot 10^{15}$ | $2.54 \cdot 10^{15}$ |
| 120 | 4 | 5 | 138259200 |
|  | 9 | 30 | $7.30 \cdot 10^{15}$ |
|  | 301 | $9.92 \cdot 10^{15}$ | $9.50 \cdot 10^{34}$ |
| 240 | 3 | 3 | 18432160 |
|  | 7 | 15 | $1.17 \cdot 10^{15}$ |
|  | 301 | $9.93 \cdot 10^{15}$ | $1.68 \cdot 10^{203}$ |

In the literature, the indexing of the suffix is generally performed according to two different techniques. The first attributes an index taking account of the total number of vectors situated on a given hypersurface (cardinality). Another approach exploits the symmetries of a network using the concept of leaders. The leaders of an envelope of norm $l_p$ correspond to a few network vectors from which all the other network vectors situated on the corresponding envelope can be obtained by permutations and changes of sign of their co-ordinates. These two approaches have a tendency to have similar rate/distortion performances for isotropic sources.

However, most works on network indexing propose solutions solely for Laplacian or Gaussian distributions, which are particular cases of GG(p), with shape parameters p=1 and p=2, respectively. A few authors propose a solution for the particular case p=0.5. However, this counting method does not enable product codes to be constructed and the indexing method is very complex in practice, in particular for p≠0.5, 1 or 2 with high dimensions and norms.

The invention proposes a novel alternative for the counting of network vectors $Z^n$ situated on envelopes GG(p) with 0<p≤2 for indexing methods of the leader type and uses the theory of partitions. The use of the theory of partitions has enabled us to overcome the complexity and the storage requirements in order to generate and index the leaders. We propose an economical counting algorithm that counts the number of leaders on an envelope of radius r, dimension d and strongest co-ordinate k for applications such as the indexing of leaders and the estimation of rate among other things.

In the following description, a first part presents the principle of the LVQ and describes the problem of indexing/counting. A second part proposes an effective solution for counting LVQ codebooks of very large size, whatever the shape parameter p. The description next specifies the cost in terms of memory of the approach proposed.

2. Indexing of Network Vectors 2.1 Definition of a Network

A network $\Lambda$ in $R^n$ is composed of any integral combination of a set of linearly independent vectors $a_i$ (the base of the network) such that:

$$A = \{x | x = u_1 a_1 + u_2 a_2 + \ldots u_n a_n\} \quad (1)$$

where $u_i$ are integers. The partitioning of the space is therefore regular and depends solely on the base vectors chosen $a_i \in R^m$ (m≥n). It must be noted that each set of base vectors defines a different network.

Each vector v of a network can be considered to belong to a surface or hypersurface containing vectors having a constant norm $I_p$ given by:

$$\|v\|_p = \left(\sum_{i=1}^{n} |v_i|^p\right)^{\frac{1}{p}}.$$

It is then possible to code a given network vector using a product code. It is clear that, if the distribution of the source vectors is Laplacian, an appropriate product code consists of a prefix corresponding to the norm $l_1$ of a vector and a suffix corresponding to its position on the hyperpyramid with a radius equal to the norm $l_1$ in question. The hypersurfaces of constant norm $l_1$ are called hyperpyramids. The position of the vector on a hypersurface can be obtained using a counting algorithm. Such a product code ensures uniqueness for the decoding.

In the case of sources having a generalised Gaussian distribution with a shape parameter lower than or equal to one, the superiority of the cubic $Z^n$ network on $D_4$, $E_8$ or Leech networks has been demonstrated [12]. Consequently the remainder of this document is focused on the design of an LVQ based on the cubic $Z^n$ network.

2.2 Indexing Based on a Total Counting

In the prior art several counting solutions are known that have been proposed for the case of Gaussian or Laplacian distributions and for different networks based on the principle of total counting. A recursive formula for counting the total number of network vectors situated on a hyperpyramid of norm $l_1$ is in particular known in the case of a Laplacian source distribution and for a network $Z^n$. This counting formula has been extended to generalised Gaussian source distributions with a shape factor p between 0 and 2. These solutions make it possible to determine the number of vectors situated within a given truncation norm $l_p$, but they do not propose an algorithm for assigning an actual index to the vectors of the network $Z^n$. In addition, this solution does not determine the number of vectors situated on a given hypersurface, which makes it difficult to use product codes.

The algorithm proposed in the works of the prior art indexes the vectors in accordance with the product code scheme for 0<p≤2. It is based on the generalised theta series [4] and uses the geometry of the network. For p=1 or 2, the development of this series is relatively simple. However, for other values of p, the development of this series is very complex, since no closed shape is produced and the use of formal mathematics is prohibitive. With the solution proposed, it is necessary to determine each possible norm value for the various dimensions and for high dimensions, which tends to be unfeasible in a finite time. In addition, given that the cardinality of a hypersurface may rapidly reach intractable values for practical implementation, in particular for high dimensions (see the table below), the indexing techniques based on the cardinality of the envelope may rapidly exceed computing precision.

2.3 Indexing Based on Leaders

The methods based on leaders take advantage of the symmetries of the network. They use an effective indexing algorithm on the constant norm envelopes and attribute the index not on the basis of the total number of vectors of the network but on the basis of a small number of vectors called leaders. The different symmetries of the network are treated separately, which, compared with the total counting techniques, constitutes a more effective method for indexing sources when the symmetries are not all present. In addition, the indexes managed by the coding algorithm are much smaller than the cardinality of the envelope, which makes it possible to index vectors that could not be indexed by methods based on a total counting for a given binary precision.

In the product code architecture, apart from the symmetries of the network, the suffix index contains the index of a small number of vectors (leaders) from which all the other vectors of the hypersurface can be assigned. For the network $Z^n$, the symmetries correspond to two basic operations: changes in sign and permutations of the vectorial co-ordinates. The first operation corresponds to a change of the octant where the vector is situated. For example, the vector (7, −3) of dimension 2 is in the fourth octant, while the vector (−7, −3) is in the third one. These vectors are symmetrical with respect to the y axis. The second operation corresponds to the intra-octant symmetry when, for example, the vectors (−7, 3) and (−3, 7) are both in the second octant and symmetrical with respect to the bisector of the octant. In this case, it can be observed that all these vectors can be generated from permutations and changes of sign of the vector (3, 7), which is the leader of all these vectors. With all the permutations and changes of sign, the leader (3, 7) can represent 8 vectors. This ratio increases rapidly with the dimension of the hypersurface (see Table 1).

Consequently, instead of directly indexing all the vectors on a hypersurface, this indexing method assigns to each vector a set of three indices: one corresponding to its leader and the other two corresponding to its permutation and to the changes of sign of the leader. For more details on the method for calculating the permutation and sign indices see 1' [5].

3. Counting Method Proposed

The invention proposes a solution for counting leaders. To give a better understanding of the context of use of such a counting algorithm, we shall give below a non-limitative example of use for indexing leaders. Firstly, we shall speak of indexing for a norm l, and secondly we shall give an example for the more general case of the norm $l_p$. Next, in section 3.3, we shall detail the invention.

3.1 Leader Indexing for Norm $l_1$ 3.1.1 Principle

The method for indexing leaders to which the counting algorithm proposed applies is based on the classification of all the leaders in reverse lexicographical order and attributes an index according to the number of leaders preceding the leader that is to be indexed. In this case, the indexing is no longer based on a search algorithm with a high consumption of resources or direct addressing, but on a counting algorithm of low cost that depends solely on the quantity of leaders rather than explicit knowledge of each of them, which makes it possible to avoid the construction of conversion tables.

A hyperpyramid of radius r is composed of all the vectors $v = (v_1, v_2, \ldots, v_d)$ so that $||v||_1 = r$. As described previously, the leaders are the elementary vectors of a hypersurface from which permutation and change of sign operations lead to all the other vectors situated on this hypersurface. As a matter of fact, the leaders are vectors that have positive co-ordinates sorted in increasing (or decreasing) order. Consequently, the leaders for the norm $l_1$ equal to r and the dimension d are vectors that satisfy the following conditions:

1- $\sum_{i=1}^{d} v_i = r;$

2- $0 < v_i < v_j,$ for $i < j$ and $i, j \in [1, d]$.

3.1.2 Link with the Theory of Partitions

In the case of a norm $l_1$ it can be noted that the conditions presented in section 3.1.1 are related to the theory of partitions in the theory of numbers. As a matter of fact, in the theory of numbers, a partition of a positive integer r is a way of writing r as a sum of d positive integers (also referred to as a part). The number of distinct partitions (independent of the order) of r is given by the partition function P(r) so that:

$$\sum_{r=0}^{\infty} P(r) y^r = \prod_{d=1}^{\infty} \left( \frac{1}{1 - y^d} \right), \quad (2)$$

which corresponds to the reciprocal of Euler's function, also referred to as series q [10, 16, 17]. Additional mathematical developments lead to representations of the function P(r) making it possible to accelerate the calculations.

For example, for r=5, equation (2) gives the result P(5)=7. As a matter of fact, all the possible partitions of number 5 are (5), (1, 4), (2, 3), (1, 1, 3), (1, 2, 2), (1, 1, 1, 2) and (1, 1, 1, 1, 1). By re-writing these partitions in the form of dimension 5 vectors such as (0, 0, 0, 0, 5), (0, 0, 0, 1, 4), (0, 0, 0, 2, 3), (0, 0, 1, 1, 3), (0, 0, 1, 2, 2), (0, 1, 1, 1, 2) and (1, 1, 1, 1, 1), we observe that these correspond exactly to the leaders of the hyperpyramid of norm r=5 and dimension d=5, i.e. these are the only vectors in the hyperpyramid of norm r=5 and dimension d=5 that satisfy both conditions of section 3.1.1. However, we are generally concerned with envelopes of norm l1 equal to r in a d-dimensional network with r≠d. In this case, it is possible to use the function q(r, d) [10, 18] that calculates the number of partitions of r with no more than d parts (in the theory of partitions this is equivalent to calculating the number of partitions of r not comprising any element greater than d with any number of parts). Consequently, for a hyperpyramid of norm r=5 and dimension d=3, we have q(5, 3)=5, i.e. five leaders given by: (0, 0, 5), (0, 1, 4), (0, 2, 3), (1, 1, 3) and (1, 2, 2).

The function q(r, d) can be calculated from the recurrence equation:

$$q(r,d) = q(r,d-1) + q(r-d,d) \quad (3)$$

with q(r, d)=P(r) for d>r, q(1, d)=1 and q(r, 0)=0.

3.1.3 Use of the Function q(r, d) for Indexing the Leaders

As described below, not only does the equation (3) give the total number of leaders situated on a given hyperpyramid, but it can also be used to attribute on the fly unique indices for the leaders, without requiring conversion tables. In order to illustrate the principle of the indexing algorithm, let us assume that the leaders of a given hyperpyramid are classified in reverse lexicographical order as follows:

| Index value | Leader |
|---|---|
| 0 | $(0, \ldots, 0, 0, r_n)$ |
| 1 | $(0, \ldots, 1)\, 0, 1, r_n - 1$ |
| 2 | $(0, \ldots, 2)\, 0, 2, r_n - 2$ |
| 3 | $(0, \ldots, 2)\, 1, 1, r_n - 2$ |
| . | . |
| . | . |
| . | . |

Thus, the index of a leader 1 corresponds to the number of leaders that precede it. In the example described above, the leader $(0, \ldots, 1, 1, r_n-2)$ must be assigned to the index 3.

Mathematical Proposition Number 1 Describes the Algorithm for the Indexing of a Leader:

Proposition 1. Let $v=(v_1, v_2, \ldots, v_n)$ be a network vector $Z^n$ with a leader $1=(x_1, x_2, \ldots, x_n)$ situated on an envelope of constant norm $1_1$. Its leader index $l_1$ is given by:

$$l_1 = \sum_{\substack{j=0 \\ \text{as long as } x_{n-(j+1)} \neq 0}}^{n-2} \sum_{i=x_{n-j}+1}^{\min[x_{n-(j-1)}, r_{n-j}]} \bar{q}(r_{n-j} - i, n - (j+1), i) \quad (4)$$

where $\bar{q}(r, d, k)$ calculates the number of partitions of r with no more than d parts lower than or equal to k, with $\bar{q}(0, d, k)=1$ and $x_{n+1}=+\infty$.

Demonstration. Let us consider a leader $1=x_1, x_2 \ldots, x_n)$ of dimension n and norm $1_1\, r_n=\Sigma_{i=1}^n x_i$ that has to be indexed. Since the leaders are sorted in reverse lexicographical order, a first group of leaders placed before 1 is composed of all the leaders where the $n^{th}$ component is strictly greater than $x_n$, i.e. all the leaders have the highest co-ordinate $g_n$ satisfying $x_n+1 \leq g_n \leq r_n$. In order to count the number of leaders in this first group without listing them all, we use the partition function $q(r, d)$. As a matter of fact, the number of leaders where the $n^{th}$ co-ordinate is equal to $g_n$ can easily be calculated using the following remark:

Remark: the calculation of the number of leaders of norm $r_n$ and dimension n where the greatest co-ordinate is equal to $g_n$ amounts to calculating the number of partitions of the number $r_n - g_n$ with no more than n-1 parts without any part greater than $g_n$. In the majority of cases, we can count this number of partitions by applying $q(r_n-g_n, n-1)$. However, this approach is valid only if $r_n-g_n \leq g_n$, in which case it is implicitly assumed that all the partitions of $r_n-g_n$ have no part greater than $g_n$. However, in a more general case, in which $r_n-g_n \leq g_n$ is not guaranteed (for example, the number of leaders of norm $r_n=20$ and dimension n=5 with the greatest part equal to 7 would lead to $q(20-7, 5-1)=q(13, 4)$, where $20-7 \not\leq 7$), the calculation of $q(r_n-g_n, n-1)$ would lead to an erroneous number of valid leaders, since some partitions of $r_n-g_n$ would have their greatest part superior to $g_n$, in which case the condition 2 in section 3.1.1 would not be complied with.

In such a situation, we must apply a second constraint to the calculation of the number of partitions: the value of the largest part. We then introduce a generalisation of $q(r, d)$, given by the function $\bar{q}(r, d, k)$, which calculates the number of partitions of a given number r with no more than d parts without any part greater than k. The calculation of $\bar{q}(r, d, k)$ is done by means of a counting algorithm, such as the one that is the subject of this invention.

Consequently we can calculate the correct number of valid leaders by applying $\bar{q}(r_n-g_n, n-1, g_n)$. Thus the variation of $g_n$ from $x_n+1$ to $r_n$ makes it possible to determine the number of leaders where the greatest co-ordinate is strictly greater than $x_n$, given by:

$$\sum_{i=x_n+1}^{r_n} \bar{q}(r_n - i, n - 1, i) \quad (5)$$

where it is assumed that $\bar{q}(0, d, k)=1$, $\forall d \in Z^+$ and $\forall k \in Z^+$. In this case, we use the overall notation used in the theory of numbers, where $Z^+$ represents all the positive integers $\{i \in Z | i > 0\}$ and $Z^*$ all the non-negative integers $\{i \in Z | i \geq 0\}$.

A second group of leaders preceding 1 is composed of all the leaders where the $n^{th}$ co-ordinate is equal to $X_n$ but with one $(n-1)^{th}$ co-ordinate strictly greater than $x_{n-1}$. In order to count this number of leaders, we can use the same remark previously mentioned, but this time applying to the dimension n-1. We can then calculate the number of leaders where the largest component $g_n=x_n$ and the second largest component $(g_{n-1}>X_{n-1})$ using $\bar{q}((r_n-x_n)-g_{n-1}, (n-1)-1, g_{n-1})$ or $\bar{q}(r_{n-1}-g_{n-1}, n-2, g_{n-1})$ by varying from $g_{n-1}$ to $x_{n-1}+1$ to $\min(x_n, r_{n-1})$. The min function guarantees that the norm $r_n$ and $g_{n-1} \leq g_n = X_n$ are complied with.

While awaiting the result at the additional dimensions, the number of leaders where the highest co-ordinate is equal to $x_n$, but which precedes 1, can be obtained by:

$$l_1 = \sum_{\substack{j=1 \\ \text{as long as } x_{n-(j+1)} \neq 0}}^{n-2} \sum_{i=x_{n-j}+1}^{\min[x_{n-(j-1)}, r_{n-j}]} \bar{q}(r_{n-j} - i, n - (j+1), i) \quad (6)$$

The combination of equations (5) and (6) leads to a general formula for calculating the total number of leaders placed before 1, and therefore the index $l_1$ of 1 (equation (4)):

$$l_1 = \sum_{\substack{j=0 \\ \text{as long as } x_{n-(j+1)} \neq 0}}^{n-2} \sum_{i=x_{n-j}+1}^{\min[x_{n-(j-1)}, r_{n-j}]} \bar{q}(r_{n-j} - i, n - (j+1), i)$$

where $x_{n+1}=+\infty$ for $j=0$ 3.2 Generalisation to the Case of a Norm $l_p$ In order to calculate the index of the leader $1=(x_1, x_2, \ldots, x_n)$ of a vector $v=(v_1, v_2, \ldots, v_n)$ situated on an envelope of constant norm $l_p$, with $0<p \leq 2$, the same principle is applied as in the case of $l_1$. The leaders are listed in reverse lexicographical order and the indexes attributed using the same counting approach. Consequently the structure of equation (4) is again appropriate, where the sum on i with the function $\bar{q}$ calculates the number of leaders according to a given co-ordinate and the sum on j allows recursion on the dimension.

However, the use of $\bar{q}$ implicitly means that the sum terms $x_i^p$ of a norm r are integers and may be any integer in the range $[0, r]$. This is obviously valid for p=1, where the sum terms are the positive integer network co-ordinates themselves. On the other hand, for $p \neq 1$, the sum terms $x_i^p$ are not necessarily integers or may not be any integer in the range $[0, r]$ (for example, for p=2 the sum terms are integers, but only square numbers).

Figure 2:
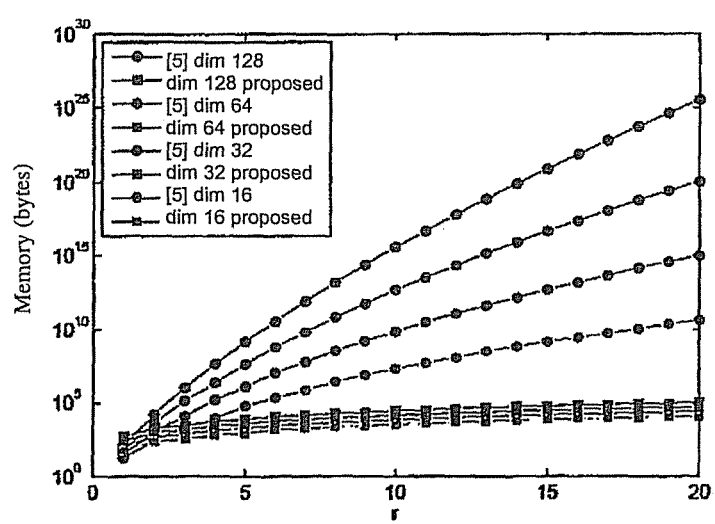
FIG. 2 shows a comparison of the memory requirements between the usual method and the method proposed for p=1, $\delta = 1$ and B=4; and
  Appendices 1 and 2 show two examples of counting algorithms for implementing the invention.

It is possible to solve this problem by rounding $x_i^p$ to the nearest whole number with a precision δ. A similar technique was used in [7, 9]. This operation introduces a new subset of integers $\$_\delta^p$ composed of all the integers $\bar{x}_i$, where $$\bar{x}_i = \left[\frac{x_i^p}{\delta}\right],$$

being the nearest whole number and $x_i \in Z^+$. The norm $l_p$ of a vector is then known with a precision δ and is obtained by:

$$r_{\delta,n}^p = \sum_{i=1}^{n} \bar{x}_i = \sum_{i=1}^{n} \left[\frac{x_i^p}{\delta}\right] \quad (7)$$

where the precision δ defines the width of the envelopes of constant norm $r_{\delta,n}^p$, comprising more vectors as its value increases (see FIG. 2).

FIG. 1: example of envelope of $r_{\delta,2}^p=15$, p=0.4 et δ=0.3 for a network $Z^2$. Consequently the calculation of the leader index of a vector in a constant norm $l_p$ corresponds to the calculation of a correct number of partitions of an integer number but using only integers belonging to the subset $\$_\delta^p$. Mathematical proposition number 2 describes the indexing algorithm for the case $l_p$:

Proposition 2. Let $v=(v_1, v_2, \ldots, v_n)$ be a network vector $Z^n$ with a leader $1=(x_1, x_2, m, x_n)$ situated on an envelope of constant norm $l_p$. Its leader index $l_1$ is given by:

$$l_1 = \sum_{\substack{j=0 \\ \text{as long as } e\, x_{n-(j+1)} \neq 0}}^{n-2} \sum_{i=x_{n-j}+1}^{\min[x_{n-(j-1)}+f(r_{\delta,n-j}^p)]} \bar{q}_\delta^p \quad (8)$$

$$(r_{\delta,n-j}^p - t(i), n - (j+1), i) + \min(f(\bar{x}_1), x_2) - x_1$$

where $\bar{q}_\delta^p(r, d, k)$ calculates the number of partitions of $r \in \$_\delta^p$ with no more than d parts less than or equal to $k \in Z^*$, with $\bar{q}_\delta^p(0, d, k)=1$ and $x_{n+1}=+\infty$. f(a) provides the maximum value $i \in Z^*$ so that $t(i) \leq a$, for a $$\in \$_b^p \text{ et } t(i) = \frac{i^p}{\delta}$$

Demonstration: Let us consider a leader $1=(x_1, x_2, \ldots, X_p)$ of dimension n and norm $l_p$ $r_n = \sum_{i=1}^{n} x_i^p$ having to be indexed. As described previously, the same principle is used as equation (4). However, using the function is no longer possible, since the sum terms of a norm $l_p$, with p≠1, are not always integers.

Rounding $x_i^p$ to the nearest whole number with a precision δ makes it possible to obtain an integer norm $r_{\delta,n}^p$ from a sum of positive integer values $\bar{x}_i$, as defined in equation (7). Consequently the index of a leader 1 situated on an envelope of p≠1 with a precision δ can be calculated by counting the number of different ways of writing $r_{\delta,n}^p=r$ as being the sum of $\bar{x}_i \in \$_\delta^p$, where $\$_\delta^p$ is the whole of the image of the function t defined by t: $Z^* \to \$_\delta^p$ which matches $x_i \to \bar{x}_i$ where $$t(x_i) = \bar{x}_i = \left[\frac{x_i^p}{\delta}\right]$$

It is important here to note that, depending on the values of p and δ, the function t may represent a non-injective function, given that different values of $Z^*$ can be matched with the same value in $\$_\delta^p$. Consequently, different leaders $1 \in Z^{n+}$ can have the same representation in $\$_\delta^{pn}$ and any naive procedure for counting the number of partitions in $\$_\delta^{pn}$ would lead not only to an erroneous leader index but also to attributing the same erroneous index to distinct leaders. We define as a solution the function $\bar{q}_\delta^p(r, d, k)$ as being the function that counts the number of partitions of $r \in \$_\delta^p$ with no more than d parts, where a part is given by $t(i) \in \$_\delta^p$: with no i greater than k, for i, $k \in Z^*$. It should be noted that the constraint on the value of the largest part in $\$_\delta^p$ using indirectly a value k of $Z^*$ makes it possible to count the number of different leaders that lead to the same partition in $\$_\delta^{pn}$.

Consequently, using $\bar{q}_\delta^p(r, d, k)$, equation (4) can be extended for norms $l_p$ by:

$$l_1 = \sum_{\substack{j=0 \\ \text{as long as } x_{n-(j+1)} \neq 0}}^{n-2} \sum_{i=x_{n-j}+1}^{\min[x_{n-(j-1)}+f(r_{\delta,n-j}^p)]} \bar{q}_\delta^p(r_{\delta,n-j}^p - t(i), n - (j+1), i)$$

(9)

where f(a) provides the maximum value $i \in Z^*$ so that $t(i) \leq a$, for $a \in \$_\delta^p$:

By varying j from 0 to n−2 in the equation (9) the number of leaders preceding 1 for the co-ordinates $x_n$ to $x_2$ is counted correctly. In the case of the norm $l_1$, it is a sufficient condition to calculate the total number of previous leaders, given that there exists a single value $x_1 \in Z^*$ for which $x_1 + \Sum_{i=2}^{n} x_i = r_n^*$. However, for the norm $l_p$, it is possible that several values $x_1 \in Z^*$ lead to because of the $\bar{x}_1 + \Sum_{i=2}^{n} \bar{x}_i = r_{\delta,n}^p$ non-injection of the function t. Consequently, in order to guarantee the uniqueness of the index, the difference between $\min(f(\bar{x}_1), x_2)$ and $x_1$ is calculated and this is added to the result of the equation (9), in order to obtain the unique decodable leader index given by the equation (8):

$$l_1 = \sum_{\substack{j=0 \\ \text{as long as } x_{n-(j+1)} \neq 0}}^{n-2} \sum_{i=x_{n-j}+1}^{\min[x_{n-(j-1)}+f(r_{\delta,n-j}^p)]} \bar{q}_\delta^p$$

$$(r_{\delta,n-j}^p - t(i), n - (j+1), i) + \min(f(\bar{x}_1), x_2) - x_1$$

The function min is required given that $(f(\bar{x}_1)$ may be greater than $x_2$ whereas $x_1$ may be smaller than or equal to $x_2$. The calculation of $\bar{q}_\delta^p(r, d, k)$ is done by means of a counting algorithm. In the following section we disclose the algorithm that is the subject of the invention.

3.3: Counting Algorithm

The function $\bar{q}_\delta^p$ proposed is defined as being the equivalent of the number of partitions of the norm $r_{\delta,d}^p = r$ with no more than d parts and with the greatest part t(i) with $i \leq k$.

Consequently we calculate $\bar{q}_\delta^p(r, d, k)$ with a recursion in the dimension as follows:

$$\bar{q}_\delta^p(r, d, k) = \sum_{j=i_{min}(r,d)}^{k} \bar{q}_\delta^p(r - t(i), d - 1, i) \quad (10)$$

where imin(r, d) provides the minimum value of $i \in Z^*$ satisfying $$t(i) \geq \left\lceil \frac{r}{d} \right\rceil.$$

This represents the major part of the last partition of norm $r_{\delta,d}^p = r$ and of dimension d in reverse lexicographical order.

For the dimension d=1, $\bar{q}_\delta^p(r, 1, k)$ is initialised with the number of different positive integers i≤k so that t(i)=r. For example, for p=0.5 and δ=0.1, we define $\bar{q}_\delta^p$ (57, 1, k) at 0 if k≤31, at 1 if k=32 and at 2 if k≥32, given that r=57 is matched in $\$_{Q1}^{Q5}$ using the function t only on i=32 and $$i = 33\left(t(32) = \left\lceil \frac{32^{0.5}}{0.1} \right\rceil = t(33) = \left\lceil \frac{33^{0.5}}{0.1} \right\rceil = 57\right).$$

It should be noted that the function $\bar{q}_\delta^p$ is the generalization of the function $\bar{q}$, given that for p=1 and δ=1 we have $\$_\delta^p = Z^*$. Algorithms 1 and 2 presented in the appendix initialise and calculate $\bar{q}_\delta^p(r, 1, k)$.

3.4. Memory Cost

In the case where $\bar{q}_\delta^p(r, d, k)$ is not calculated on line, the memory requirements can be calculated as described below. The $\bar{q}_\delta^p$ stored can be interpreted as being a three-dimensional table, where the first input is the value $r \in \$_\delta^p$, the second is the dimension $d \in Z^*$ and the third is the maximum network value $k \in Z^*$. The maximum memory requirement provided is then r·d·k·B bytes, where B is the number of bytes per element of $\bar{q}_\delta^p$.

However, the limit for the effective coding and decoding steps for a given maximum norm $r_{\delta,n}^p = r$ and a dimension d is lower. This is because, from equations (8) and (10), it can be observed that the largest value of the first two input variables of $\bar{q}_\delta^p$ is obtained when j=0 and i=imin(r, d). In this case, we calculate $$\bar{q}_\delta^p(r - t(imin(r, d), d - 1, imin(r, d))) = \bar{q}_\delta^p\left(r - \left\lceil \frac{r}{d} \right\rceil, d - 1, imin(r, d)\right).$$

Consequently it suffices to use the first input variable (related to the norm) over the range $$\left[0, r - \left\lceil \frac{r}{d} \right\rceil\right]$$

and the second (related to the dimension) over the range [1, d−1].

The value of k can be determined from r. Since the second constraint is required only if $$t(k) \leq \frac{r}{2}$$

the maximum value of k can be defined at $$k = f\left(\frac{r}{2}\right)$$

in order to index any leader having a norm in the range [0, r] and a dimension [1, d]. Consequently, the upper limit of memory cost for the coding and decoding steps is given by:

$$\#M = \left(\left(r - \left\lceil \frac{r}{d} \right\rceil\right) + 1\right) \times (d - 1) \times \left(f\left(\left\lfloor \frac{r}{2} \right\rfloor\right) + 1\right) \cdot B \text{ bytes} \quad (13)$$

It should be noted that the memory requirement mainly depends on the norm and the dimension of the envelopes. The number of leaders determines the choice of B.

FIG. 3 illustrates the memory saving using the indexing algorithm, with the table $\bar{q}_\delta^p$ calculated offline. The memory requirement is represented from the equation (13) according to the radius r for p 1, δ=1 and B=4 (i.e., data of the integer type) and is compared with the upper memory limit of the convention methods based on leaders as described in [5]. It should be noted that, even for a dimension and a radius as low as 16 and 20 respectively, the conventional methods require no more than 10 gigabytes of memory while the method proposed requires less than 100 kilobytes.

The extremely small memory requirements and the fact that it is not necessary to know all the leaders makes it possible to index the network vectors in dimensions as high as 64, 128, 256, 512, etc. In the prior works, the practical applications were limited to a dimension of 16.

APPENDIX

Counting Algorithms

---

ALGORITHM 1

```
/* Construction of the table q̄_δ^p [r][d][k]. For a maximum norm value
r_{δ,d}^p = r and dimension d, this algorithm creates the 3-D table q̄_δ^p of
dimensions ((r − ⌈r/d⌉)−1)×(d − 1)×((f(⌊r/2⌋))−1).
r_bckp = r;
k = f[floor((double)r/2.)];
r = r-ceil((double)r/(double)d);
d--;
{q̄_δ^p,f,t} = init(r_bckp,r,d,k);// Initialises q̄_δ^p
{
for(j=1;j<d;R++)
{
   for(R=1;R<=r;R++)
   {
   N_p = 0;
   for(i=imin(R,j+1);i<=f[R];i++)
   {
     rmd = R-t[i];
     if(t[i]>rmd)// No second constraint
     N_p += q̄_δ^p [rmd][j-1][0];
     else
     N_p += q̄_δ^p[rmd][j-1][i];
     if(i<=k)
```

ALGORITHM 1 (continued)

```
q̄_δ^p [R][j][i] = N_p; // Values with
}                       // second constraint
q̄_δ^p [R][j][0] = N_p;// Values without second constraint
  }
}
return ¹q̄_δ^p ;// The function ends here
/* The function init(r_bckp,r,d,k) is detailed in algorithm 2.
The function imin(r,d) provides the smallest value i∈Z*
``` such that $\left[\frac{i^p}{\delta}\right] \geq \left\lceil\frac{r}{d}\right\rceil$ (See equation (?? ?).) */

ALGORITHM 2

```
/* Function init(r_bckp,r,d,k) that serves for the initialisation of the table
q̄_δ^p [r][d][k] and the creation of the vectors f and t used
in algorithms 1.*/
  q̄_δ^p = 0_{r+1,d,k+1}; ; //Table of zeros of dimension (r+1) × d × (k+1)
  f = 0_{r_bckp+1} ; // Vector of zeros of dimension r_bckp + 1
  t = 0_{f(r_bckp)+2}; // Vector of zeros of dimension f(r_bckp) + 2
  f[r_bckp] = f(r_bckp) ;
  for( i=0 ; i<=f [r_bckp] ; i++ )
  {
    do{
    if(t[i]<=r)
    {
    q̄_δ^p [t[i]][0][0]++;//ᵃ
    if(i<=k)
    q̄_δ^p [t[i]][0][i] = e[t[i]][0][0];//ᵇ
    }
    i++;
    t[i] = t(i);
    }while(t[i]==t[i-1]);
    i--;
    f[t[i]] = f(t[i]);
    for( j=t[i]+1; j<min(t[i+1], r_bckp) ; j++)
    f[j]= f[t[i]];
  }
  for(j=1;j<d;j++)//
  q̄_δ^p [0][j][0] = 1;
  return {q̄_δ^p,f,t};// The function terminates here
  /*ᵃ Initialises q̄_δ^p for the first dimension without second constraint
for all the norms from 0 to r.
  ᵇ Initialises q̄_δ^p for the first dimension with second constraint
of imin(t(i),1) a f(t(i)) for all the norms from 0 to r.
  ᶜ Initialises q̄_δ^p for all the dimensions beyond the first without second
constraint and for the norm 0. The vectors f and t are initialised using the
functions f and t respectively.*/
```

The invention claimed is:

1. A method for processing digital data by estimating a number of leader vectors in a regular point network having a norm $1_p$ as being equal to an envelope, $r_{\delta,d}^p$, of dimension d and the co-ordinates of which are lower than or equal to k, where δ is precision and k is an integer representing a maximum network value, the method comprising computer readable memory having instructions stored thereon that, when executed by a computer processor, performed the method of:

determining results of a function $T(x_i)$ for i varying between 1 and d, where the function $T(x_i)$ provides, for at least some of the leader vectors, a result of the division of the co-ordinate $x_1$ raised to the power p by a delta precision factor, the result of the division being rounded to the nearest whole number; and determining an envelope, $r_{\delta,d}^p$, by summing the results of a function $T(x_i)$ for i varying between 1 and d, wherein the method not comprising any step of determining leader vectors.

2. The method according to claim 1, wherein the step of determining an envelope further comprises, for the values of n between d and 1, the sum of the result of a function $\bar{q}_\delta^p$ (r−T(u), n−1, u) is carried out, for u varying between a minimum value $u_{min}$ (r, n) and k, the function $\bar{q}_\delta^p$ (r, n, k) providing the quantity of leader vectors of norm $r_{\delta,n}^p$=r and dimension n, and the co-ordinates of which are lower than or equal to k, the function $u_{min}$ providing the smallest integer value u that satisfies T(u) greater than or equal to r/n.

3. The method according to claim 2, further comprising carrying out a prior initialisation step including attributing, for n=1, to the function $\bar{q}_\delta^p$ (r,1,k) a value corresponding to the number of possible values of u smaller than or equal to k, such that T(u)=r, and then in executing the summing step, wherein the step of carrying out a prior initialisation is performed prior to the step of determining results of a function.

4. A method for estimating rate in the context of data compression comprising a sub-method according to claim 1.

5. A method for indexing leader vectors comprising a sub-method according to claim 1.

6. The method according to claim 1, further comprises a quantisation step of calculating in a dimension space d at least one leader index $l_1$ for at least one part of vectors 1, the said vectors 1 constituting descriptors of input data, leader index $l_1$ corresponding to the number of vectors that precede the leader 1 in reverse lexicographical order without the step of determining all the leaders, wherein the quantisation step is performed prior to the step of determining results of a function.

* * * * *